US008892369B2

(12) United States Patent
Furuya et al.

(10) Patent No.: US 8,892,369 B2
(45) Date of Patent: Nov. 18, 2014

(54) STORAGE MEDIUM, PREDICTING APPARATUS, AND PREDICTING METHOD (75) Inventors: Hiroyuki Furuya, Kawasaki (JP); Atsushi Yamaguchi, Kawasaki (JP); Kazuhiro Nitta, Kawasaki (JP); Tadashi Katsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 462 days.

(21) Appl. No.: 13/221,112

(22) Filed: Aug. 30, 2011

(65) Prior Publication Data
US 2012/0072132 A1  Mar. 22, 2012

(30) Foreign Application Priority Data
Sep. 21, 2010  (JP) .................................. 2010-211231

(51) Int. Cl.
G01F 1/00  (2006.01)
G06F 1/20  (2006.01)
(52) U.S. Cl.
CPC ...................................... *G06F 1/206* (2013.01)
USPC ........................................................... 702/45

(58) Field of Classification Search
None
See application file for complete search history.

(56) References Cited

U.S. PATENT DOCUMENTS 6,278,958 B1 * 8/2001 Lee et al. ....................... 702/183
2010/0252358 A1 * 10/2010 Rodrigues et al. ............ 181/206

FOREIGN PATENT DOCUMENTS

JP  2001-108642  4/2001

\* cited by examiner

*Primary Examiner* — Aditya Bhat
(74) *Attorney, Agent, or Firm* — Staas & Halsey LLP

(57) ABSTRACT

A predicting apparatus includes an obtaining unit and a predicting unit. The obtaining unit included in the predicting apparatus obtains actual measurements of data about a fan being rotated at a predetermined revolution frequency N [rpm]. The predicting apparatus then predicts data about the fan to be rotated at a revolution frequency N' that is different from the predetermined revolution frequency N based on the actual measurements of the data thus obtained.

6 Claims, 8 Drawing Sheets

| REVOLUTION FREQUENCY N' | SOUND PRESSURE LEVEL LpN' | PQ CHARACTER-ISTICS | FAN POWER w' |
|---|---|---|---|

STORAGE MEDIUM, PREDICTING APPARATUS, AND PREDICTING METHOD

CROSS-REFERENCE TO RELATED APPLICATION

This application is based upon and claims the benefit of priority of the prior Japanese Patent Application No. 2010-211231, filed on Sep. 21, 2010, the entire contents of which are incorporated herein by reference.

FIELD

The embodiments discussed herein are directed to a storage medium, a predicting apparatus, and a predicting method.

BACKGROUND

Conventionally, electronic devices often have included fans for cooling electronic components in the electronic devices. The fans installed in electronic devices suppress heating of the electronic components caused by operations of the electronic devices or a surrounding environment, for example. Therefore, fans can prevent failure of electronic devices due to overheating, and prevent potential burn injury and other accidents of a user who might touch the overheated electronic devices.

In recent years, the number of electronic components has increased due to electronic devices coming to have various functions. Furthermore, pressure loss has increased as the electronic devices become downscaled. To cope with these conditions, a fan is forced to be rotated more, and a noise caused by operation sound of a fan has become an issue. Thus, for an electronic device to which silence is expected, it is preferable to consider an appropriate cooling system design, an appropriate selection of a fan, and appropriate control, e.g., the revolution frequency, of the fan.

As a mode for implementing a method of predicting noises attributable to a fan in an electronic device, a noise is predicted based on a sound pressure level at a position one meter away from the air-suctioning side of the fan being rotated at unloaded and rated revolution frequencies, which are provided by the manufacture of the fan and the like. As another mode for predicting a noise caused by a fan in an electronic device, a prediction is made based on a loaded noise at an operating point.

In a recent technology, a thermal analysis is applied to predict a pressure difference between the front and the rear sides of a fan at an operating point, and a loaded noise and a flow rate at the operating point are predicted based on the loaded noise, the PQ characteristics, and other factors of the fan. A loaded noise of a fan is a sound pressure level with a load applied to the ventilation channel of the fan. PQ characteristics represent the pressure difference between the front and the rear sides of each fan, that is, a relationship between the static pressure (P) and the flow rate (Q) of the air caused to flow through the ventilation channel when the fan is rotated. A related-art example is described in Japanese Laid-open Patent Publication No. 2001-108642.

However, in such conventional technologies, to predict data about a fan, e.g., a loaded noise and a flow rate of the fan being rotated at a certain revolution frequency, each piece of data including the loaded noise and the PQ characteristics has to be actually measured in advance at each of many rotational frequencies at which a prediction could be possibly be made. Therefore, an enormous number of hours has been spent in performing such actual measurements.

In addition, it is desirable for the loaded noise and the flow rate of a fan to satisfy respective target conditions. In other words, it is desirable to use a revolution frequency of the fan that makes the loaded noise of the fan less than a target loaded noise, and that makes the flow rate more than a target flow rate. To explain the relationship between a loaded noise and a flow rate, reduction in the revolution frequency of a fan lowers a loaded noise of the fan but also lowers the flow rate of the fan. Increasing the revolution frequency of a fan boosts the flow rate but also involves increased loaded noise of the fan. In this manner, a loaded noise and a flow rate of a fan are in a trade-off relationship upon satisfying their target conditions. A prediction can be made as to whether a fan can satisfy both target conditions of the loaded noise and the flow rate, which are in such a trade-off relationship, and the prediction results can be used in designing an electronic device in which the fan is installed. As a method for making such a prediction, the following approach is possible. For example, it is possible to actually measure the loaded noise and the PQ characteristics at every typical revolution frequency of the fan, to store the actual measurements in an associated manner, and to use the actual measurements in predicting a loaded noise and a flow rate. Even upon predicting whether a fan can satisfy both target conditions of the loaded noise and the flow rate, that is, upon making a prediction on data about the fan, an enormous number of hours is spent in making actual measurements because each piece of the data is measured at each of the rotational frequencies of the fan.

SUMMARY

According to an aspect of an embodiment of the invention, a computer readable non-transitory storage medium storing a predicting program causes a computer to execute obtaining an actual measurement of data about a fan being rotated at a predetermined revolution frequency; and predicting data about the fan to be rotated at a revolution frequency that is different from the predetermined revolution frequency based on the actual measurement of the data thus obtained.

According to another aspect of an embodiment of the invention, a non-transitory storage medium storing a predicting program causes a computer to execute predicting a first revolution frequency that is a revolution frequency of a fan at which a sound pressure level of sound caused by rotations of the fan satisfies a condition represented as a predetermined target sound volume based on an actual measurement of a sound pressure level of sound caused by rotations of the fan being rotated at a predetermined revolution frequency and the target sound volume; and predicting a first flow rate that is a flow rate of air to be caused to flow through a ventilation channel by the fan to be rotated at the first revolution frequency thus predicted based on the first revolution frequency thus predicted, an actual measurement of a characteristic related to a static pressure and a flow rate of the fan being rotated at the predetermined revolution frequency, and a pressure loss characteristic of the ventilation channel of the fan.

According to still another aspect of an embodiment of the invention, a predicting apparatus includes an obtaining unit that obtains an actual measurement of data about a fan being rotated at a predetermined revolution frequency; and a predicting unit that predicts data about the fan to be rotated at a revolution frequency that is different from the predetermined revolution frequency based on the actual measurement of the data thus obtained.

According to still another aspect of an embodiment of the invention, a predicting apparatus includes a revolution frequency predicting unit that predicts a first revolution frequency that is a revolution frequency of a fan at which a sound pressure level of sound caused by rotations of the fan satisfies a condition represented as a predetermined target sound volume based on an actual measurement of a sound pressure level of sound caused by rotations of the fan being rotated at a predetermined revolution frequency and the target sound volume; a flow rate predicting unit that predicts a first flow rate that is a flow rate of air to be caused to flow through a ventilation channel by the fan to be rotated at the first revolution frequency predicted by the revolution frequency predicting unit based on the first revolution frequency predicted by the revolution frequency predicting unit, an actual measurement of a characteristic related to a static pressure and a flow rate of the fan being rotated at the predetermined revolution frequency, and a pressure loss characteristic of the ventilation channel of the fan.

According to still another aspect of an embodiment of the invention, a predicting method executed by a predicting unit included in a predicting apparatus, the method includes obtaining an actual measurement of data about a fan being rotated at a predetermined revolution frequency; and predicting data about the fan to be rotated at a revolution frequency that is different from the predetermined revolution frequency based on the actual measurement of the data thus obtained.

According to still another aspect of an embodiment of the invention, a predicting method includes predicting at which a revolution frequency predicting unit included in a predicting apparatus predicts a first revolution frequency that is a revolution frequency of a fan at which a sound pressure level of sound caused by rotations of the fan satisfies a condition represented as a predetermined target sound volume based on an actual measurement of a sound pressure level of sound caused by rotations of the fan being rotated at a predetermined revolution frequency and the target sound volume; and predicting at which a flow rate predicting unit included in the predicting apparatus predicts a first flow rate that is a flow rate of air to be caused to flow in a ventilation channel by the fan to be rotated at the first revolution frequency predicted by the revolution frequency predicting unit based on the first revolution frequency predicted by the revolution frequency predicting unit, an actual measurement of a characteristic related to a static pressure and a flow rate of the fan being rotated at the predetermined revolution frequency, and a pressure loss characteristic of the ventilation channel of the fan.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

Each of the embodiment explained below is not intended to limit the scope of the present invention in any way.

[a] First Embodiment

Structure of Predicting Apparatus

A predicting apparatus according to a first embodiment of the present invention will now be explained with reference to FIG. 1. The predicting apparatus according to the first embodiment predicts data about a fan being rotating at a revolution frequency that is not a predetermined revolution frequency based on an actual measurement of such data about the fan measured when the fan is rotated at the predetermined revolution frequency. Example of the data about a fan include a sound pressure level, PQ characteristics, and a fan power. PQ characteristics are also referred to as static pressure-flow rate characteristics, and indicates a relationship between a static pressure (P) and a flow rate (Q) that is caused to flow through a ventilation channel in a fan when the fan is rotated. A fan power represents a power supplied to the fan. The revolution frequency of the fan changes depending on a level of the fan power. Generally speaking, the higher the fan power is, the higher the revolution frequency becomes.

Figure 1:
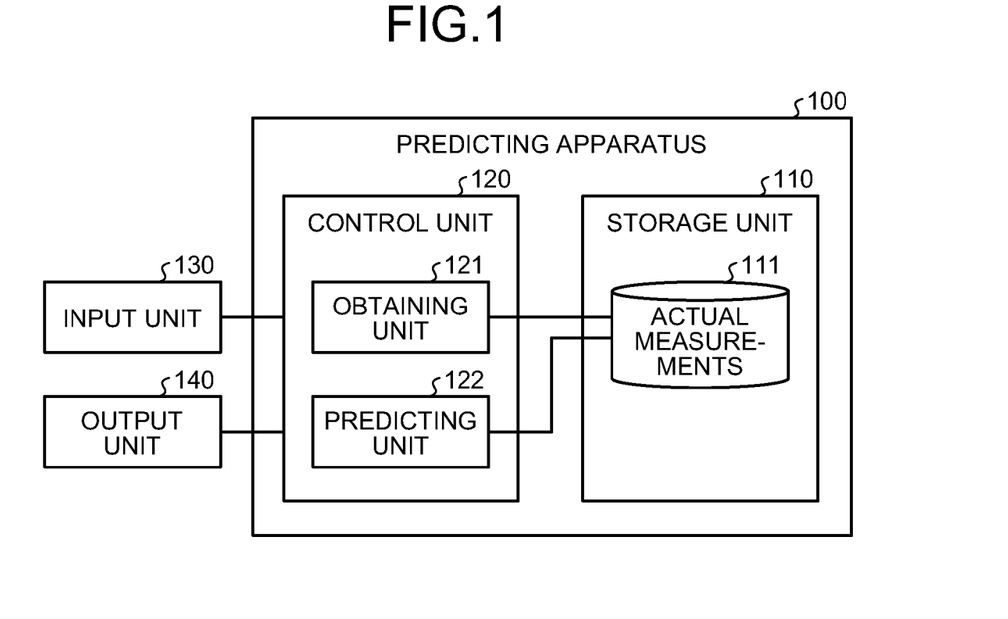
FIG. 1 is a schematic of an exemplary structure of a predicting apparatus according to a first embodiment of the present invention.

FIG. 1 is a schematic of an exemplary structure of the predicting apparatus according to the first embodiment. As illustrated in FIG. 1, a predicting apparatus 100 includes, for example, a storage unit 110 and a control unit 120. The predicting apparatus 100 is also connected to an input unit 130 and an output unit 140.

The input unit 130 receives external inputs of information. For example, the input unit 130 receives various types of information, e.g., an instruction from a user, and inputs received information, e.g., the instruction, to the control unit 110. For example, the instruction is an instruction for executing a "predicting process" to be explained later in detail. The instruction for executing the predicting process contains a revolution frequency N' [rpm] of the fan. The revolution frequency N' contained in the instruction for executing the predicting process input by the user via the input unit 130 is a revolution frequency that is different from a revolution frequency N of the fan used in actually collecting actual measurements 111 which are to be described later. This is because the user wants to know a prediction result of each data under a condition when the fan is rotated at a revolution frequency other than the revolution frequency N used upon actually collecting the actual measurements 111 to be described later. The input unit 130 is, for example, an input device such as a mouse and a keyboard.

The output unit 140 outputs information externally. For example, the output unit 140 receives information such as a prediction result, which is to be described later, from a predicting unit 122. The output unit 140 outputs received information such as the prediction result. The output unit 140 is, for example, a displaying device such as a display. If this is the case, the information such as the prediction result is displayed on the display. The output unit 140 may also be an audio output device such as a speaker, for example. If this is the case, the information such as the prediction result is output from the speaker as a voice. The output unit 140 may also output the information such as the prediction result to an external device by means of communications.

The storage unit 110 stores therein data used in various processes performed by the control unit 120, and results of the various processes performed by the control unit 120. The storage unit 110 also stores therein the actual measurements 111 to be described later. The storage unit 110 is, for example, a semiconductor memory element such as a random access memory (RAM), a read only memory (ROM), and a flash memory, or a storage device such as a hard disk and an optical disk.

Figure 2:
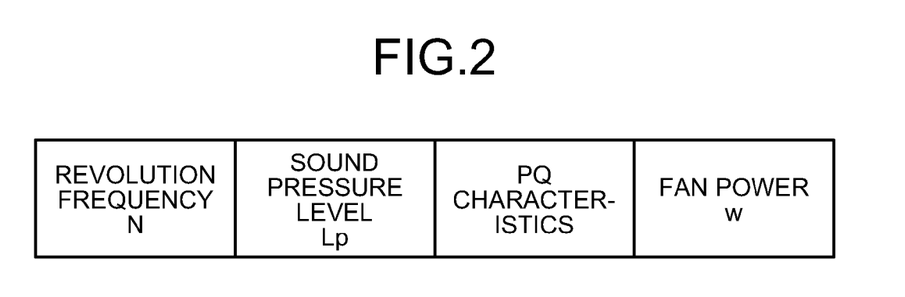
FIG. 2 is a schematic of an example of actual measurements.

The actual measurements 111 are actual measurements of a sound pressure level Lp [dB], PQ characteristics, and a fan power [W] that are actually measured while the fan is rotated at a predetermined revolution frequency. FIG. 2 is a schematic of an example of the actual measurements. The example illustrated in FIG. 2 depicts the sound pressure level Lp [dB], the PQ characteristics, and the fan power w [W] that are actually measured while the fan is rotated at a revolution frequency N [rpm].

The control unit 120 includes an internal memory for storing therein control programs, computer programs specifying various process procedures, and used data. The control unit 120 controls the entire predicting apparatus 100. The control unit 120 also includes an obtaining unit 121 and the predicting unit 122. The control unit 120 is, for example, an integrated circuit such as an application specific integrated circuit (ASIC) and a field programmable gate array (FPGA), or an electronic circuit such as a central processing unit (CPU) and a micro processing unit (MPU).

The obtaining unit 121 obtains the actual measurements. For example, the obtaining unit 121 obtains actual measurements 111 from the storage unit 110.

The predicting unit 122 predicts data about a fan. For example, the predicting unit 122 converts an actual measurement of the sound pressure level Lp [dB] measured while the fan is rotated at the predetermined revolution frequency N [rpm] and obtained by the obtaining unit 121 into a sound intensity Lp' [W/m²] representing an energy of the sound, based on Equation (1) below:

$$Lp' = 10^{-12} \times 10^{(Lp/10)} [W/m^2] \quad (1)$$

The predicting unit 122 then predicts a sound intensity $Lp'_{N'}$ [W/m²] when the fan is to be rotated at a revolution frequency N' using the predetermined revolution frequency N, the sound intensity Lp', and the revolution frequency N' [rpm] of the fan based on Equation (2) below:

$$Lp'_{N'} = Lp' \times ((N')^6 \div N^6) \quad (2)$$

In the example of Equation (2), six is used as a multiplier. However, a value near 5.5 to 6.0 may also be used as a multiplier. Speaking more precisely, the multiplier changes depending on factors such as a fan type and a wind speed. Therefore, when a precise prediction is expected, it is preferable to obtain an appropriate multiplier in advance for a specific fan by means of experiments, for example. The same can be said for the PQ characteristics and the fan power. The revolution frequency N' of the fan is a value contained in the instruction for executing a predicting process.

The predicting unit 122 then predicts the sound pressure level LpN' [dB] when the fan is to be rotated at the revolution frequency N' based on the Equation (3) below:

$$Lp'_{N'} = 10^{-12} \times 10^{(LpN'/10)} [W/m^2] \quad (3)$$

The predicting unit 122 then predicts the PQ characteristics when the fan is to be rotated at the revolution frequency N' based on the actual measurements of the PQ characteristics measured when the fan is rotated at the predetermined revolution frequency N and obtained by the obtaining unit 121.

Figure 3:
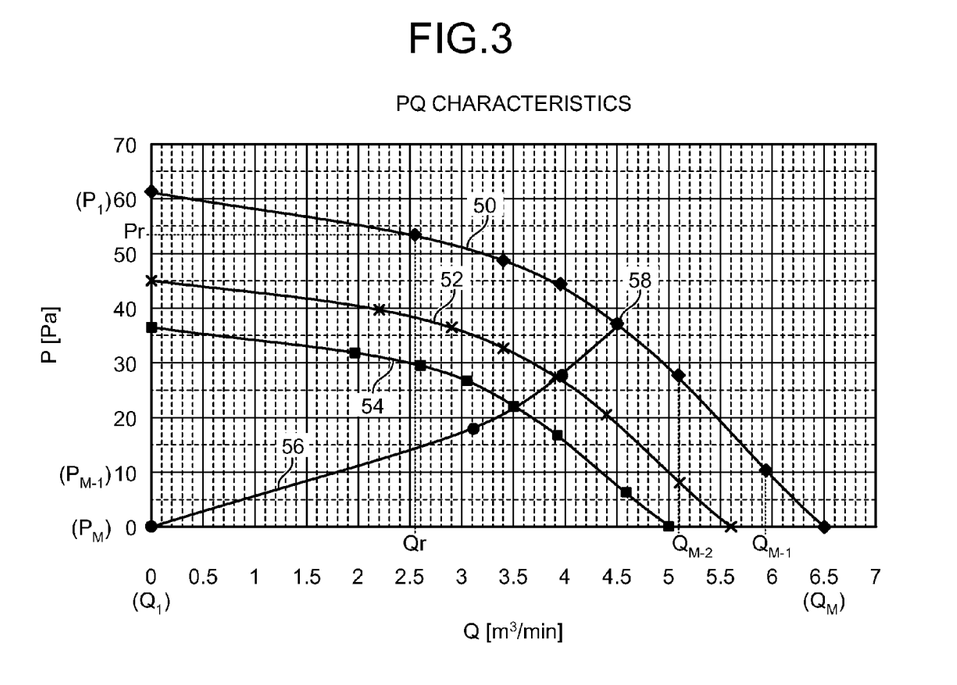
FIG. 3 is a schematic for explaining how the PQ characteristics are predicted.

An example of how the PQ characteristics are predicted will now be explained with reference to FIG. 3. FIG. 3 is a schematic for explaining how the PQ characteristics are predicted. The example illustrated in FIG. 3 depicts an actual measurement 50 of the PQ characteristics collected when the fan is rotated at the predetermined revolution frequency N, with the horizontal axis representing the flow rate Q [m³/min] and the vertical axis representing the static pressure P [Pa]. The predicting unit 122 selects a plurality of pairs of a flow rate and a static pressure (Q, P) from the actual measurement 50 of the PQ characteristics. In the explanation below, it is assumed that the predicting unit 122 selects M pairs of ($Q_i$, $P_i$) that is a pair of a flow rate $Q_i$ (i=1 to M) [m³/min] and a static pressure $P_i$ (i=1 to M) [Pa]. The predicting unit 122 then predicts respective flow rates $Q_i'$ (i=1 to M) [m³/min] with the revolution frequency of the fan being N' based on Equation (4) below:

$$Q_i' = Q_i \times (N' \div N) \quad (4)$$

The predicting unit 122 then predicts respective static pressures $P_i'$ (i=1 to M) [Pa] with the revolution frequency of the fan being N' based on Equation (5) below:

$$P_i' = P_i \times ((N')^2 \div N^2) \quad (5)$$

The predicting unit 122 then applies interpolation to each pair ($Q_i'$, $P_i'$) of the flow rate $Q_i'$ and the static pressures $P_i'$ to predict the PQ characteristics with the fan being rotated at the revolution frequency N'.

FIG. 3 depicts a prediction 52 of the PQ characteristics with the fan being rotated at the revolution frequency N'. In the example illustrated in FIG. 3, the revolution frequency N' is a value smaller than the revolution frequency N. FIG. 3 also depicts a prediction 54 of the PQ characteristics with the fan being rotated at a revolution frequency N" that is a frequency lower than the revolution frequency N'. As illustrated in FIG. 3, the lower the revolution frequency, the lower the static pressure becomes at the same flow rate.

The predicting unit 122 also predicts a fan power w' [W] when the fan is to be rotated at the revolution frequency N' based on Equation (6) below, using the actual measurement of the fan power w [W] measured when the fan is rotated at the predetermined revolution frequency N and obtained by the obtaining unit 121, the predetermined revolution frequency N, and the revolution frequency N' of the fan:

$$w' = w \times ((N')^3 \div N^3) \quad (6)$$

Figure 4:
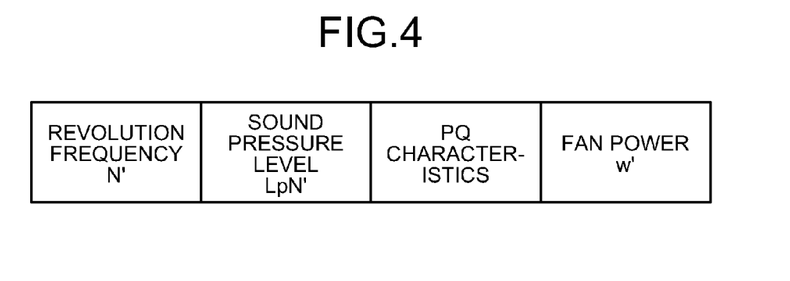
FIG. 4 is a schematic of an example of an output result of an output unit.

The predicting unit 122 then outputs the sound pressure level LpN', the PQ characteristics, and the fan power w' with the fan being rotated at the revolution frequency N', and the revolution frequency N' to the output unit 140. In this manner, the output unit outputs an output result and the like. FIG. 4 is a schematic of an example of the output result of the output unit. The sound pressure level LpN', the PQ characteristics, and the fan power w' thus predicted, and the revolution frequency N' of the fan used in the prediction are displayed as illustrated in FIG. 4.

Predicting Process

Figure 5:
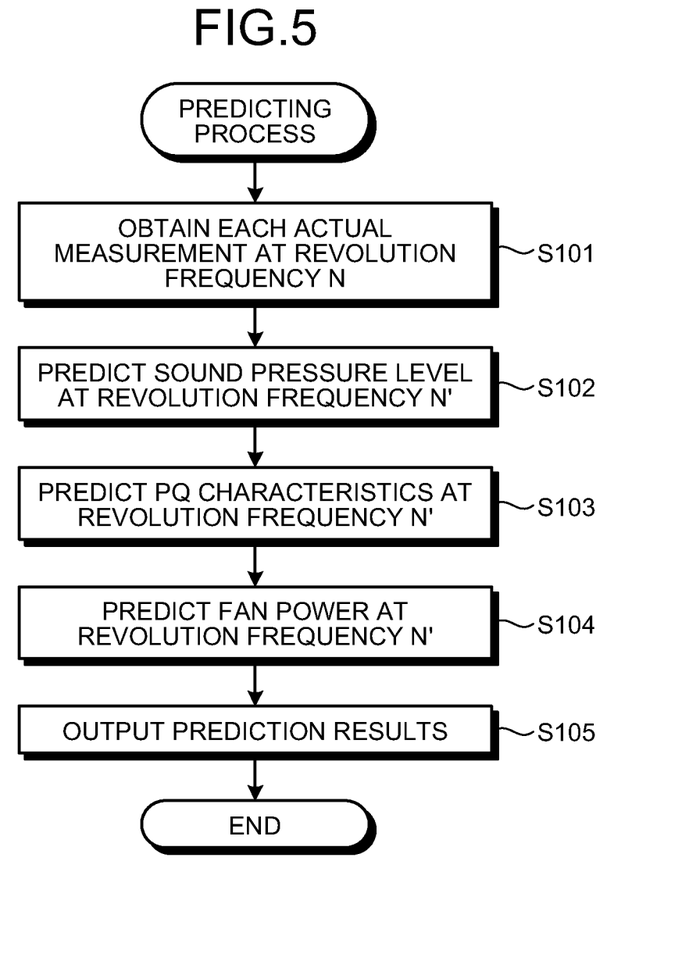
FIG. 5 is a flowchart of an example of a flow of a predicting process according to the first embodiment.

A predicting process according to the first embodiment will now be explained with reference to FIG. 5. FIG. 5 is a flowchart of an example of a flow of the predicting process according to the first embodiment. The predicting process illustrated in FIG. 5 is started when the instruction for executing the predicting process is input via the input unit 130.

As illustrated in FIG. 5, the obtaining unit 121 obtains the actual measurements 111 from the storage unit 110 (Step S101). The predicting unit 122 then predicts the sound pressure level LpN' [dB] with the fan being rotated at the revolution frequency N' based on the actual measurements 111 (Step S102).

The predicting unit 122 then predicts the PQ characteristics with the fan being rotated at the revolution frequency N' based on the actual measurements 111 (Step S103). The predicting unit 122 then predicts the fan power w' [W] with the fan being rotated at the revolution frequency N' based on the actual measurements 111 (Step S104).

The predicting unit 122 then outputs the sound pressure level LpN', the PQ characteristics, and the fan power w' thus predicted, and the revolution frequency N' to the output unit 140 (Step S105), and ends the process.

Effects Achieved by First Embodiment

As described above, the predicting apparatus 100 obtains the actual measurements 111 of the data about the fan being rotated at the predetermined revolution frequency N [rpm]. The predicting apparatus 100 then predicts the data about the fan with the fan being rotated at a revolution frequency N' that is different from the predetermined revolution frequency N, based on the actual measurements of the data thus obtained. In this manner, the predicting apparatus 100 according to the first embodiment predicts data about a fan to be rotated at a revolution frequency using the actual measurements of data about a fan measured while being rotated at another revolution frequency. Therefore, the predicting apparatus 100 according to the first embodiment can predict data about a fan using actual measurements collected in a smaller number of hours than that spent in conventional technologies.

[b] Second Embodiment

In the example explained in the first embodiment, the sound pressure level LpN', the PQ characteristics, and the fan power w' are predicted as data about a fan. However, the predicting apparatus disclosed in the present application is not limited thereto. Therefore, in a second embodiment of the present invention, an example in which other data is predicted will be explained.

Structure of Predicting Apparatus

A predicting apparatus according to the second embodiment will now be explained with reference to FIG. 6. The predicting apparatus according to the second embodiment predicts a revolution frequency, a flow rate, and a sound volume of a fan based on the actual measurements 111.

Figure 6:
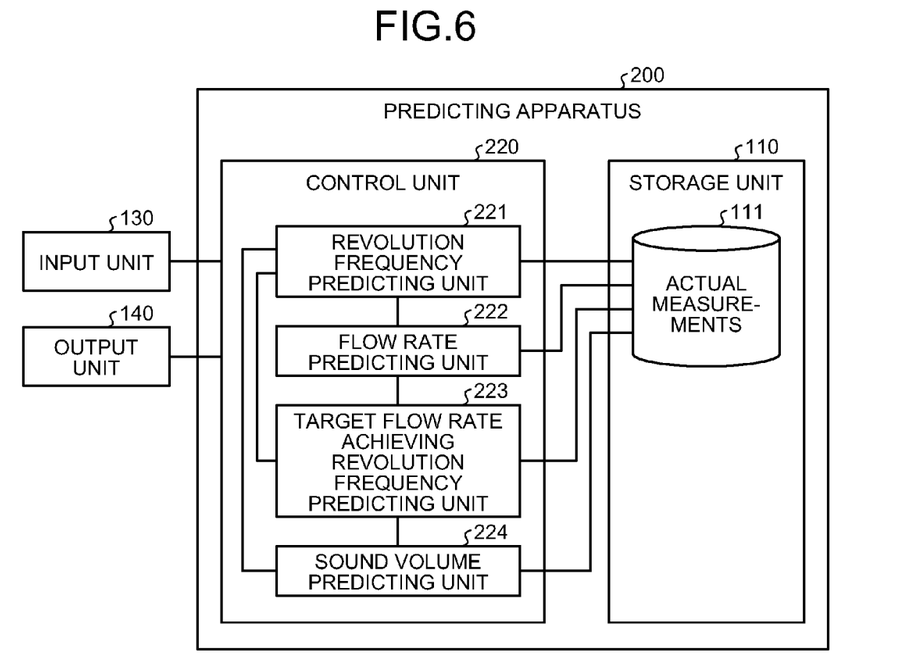
FIG. 6 is a schematic of an exemplary structure of a predicting apparatus according to a second embodiment of the present invention.

FIG. 6 is a schematic of an exemplary structure of the predicting apparatus according to the second embodiment. As illustrated in FIG. 6, a predicting apparatus 200 includes the storage unit 110 and a control unit 220. Compared with the control unit 120 according to the first embodiment illustrated in FIG. 1, the control unit 220 is different in having each of the elements described below in replace of the obtaining unit 121 and the predicting unit 122 according to the first embodiment. That is, the control unit 220 includes a revolution frequency predicting unit 221, a flow rate predicting unit 222, a target flow rate achieving revolution frequency predicting unit 223, and a sound volume predicting unit 224. In the explanation below, each of the elements achieving the same function as that according to the first embodiment is given the same reference numeral as that in FIG. 1, and an explanation thereof will be omitted hereunder.

The revolution frequency predicting unit 221 predicts a revolution frequency of a fan that satisfies a condition represented as a target sound volume based on the actual measurements 111. A revolution frequency "that satisfies a condition represented as a target sound volume" herein means a revolution frequency at which the sound pressure level of sound attributable to rotations of the fan becomes equal to or less than or less than a sound pressure level represented as a target sound volume. For example, the revolution frequency predicting unit 221 converts a target sound volume Lpg [dB] input by the user via the input unit 130 into a sound intensity Lpg' [W/m²] based on Equation (7) below:

$$Lpg' = 10^{-12} \times 10^{(Lpg/10)} [W/m^2] \qquad (7)$$

The revolution frequency predicting unit 221 then converts the actual measurement of the sound pressure level Lp [dB] to a sound intensity Lp' [W/m²] based on Equation (1) above.

The revolution frequency predicting unit 221 predicts a revolution frequency Ns' satisfying the condition represented as the target sound volume using the revolution frequency N indicated by the actual measurements 111 and the sound intensities Lpg' and Lp' based on Equation (8) below:

$$Lpg' = Lp' \times ((Ns')^6 \div N^6) \qquad (8)$$

The flow rate predicting unit 222 predicts a flow rate of the air caused to flow through the ventilation channel by the fan being rotated at the revolution frequency Ns' that is predicted by the revolution frequency predicting unit 221. For example, the flow rate predicting unit 222 obtains a coefficient k of a pressure loss curve stored in the storage unit 110. The pressure loss curve herein means a curve ($P=kQ^2$) representing a pressure loss characteristic unique to the ventilation channel to which the fan is installed. The flow rate predicting unit 222 then uses the intersection between the pressure loss curve and the curve of the actual measurement 50 of the PQ characteristics as an operating point, and predicts the flow rate at the operating point as a flow rate with the fan being rotated at the revolution frequency Ns'. A specific example of how the flow rate is predicted will now be explained with reference to FIG. 3. In the example illustrated in FIG. 3, the flow rate at an operating point 58 that is the intersection between a pressure loss curve 56 and the curve of the actual measurement 50 of the PQ characteristics is 4.5 [m³/min]. Therefore, in the example illustrated in FIG. 3, the flow rate predicting unit 222 predicts the flow rate to be 4.5 [m³/min].

The target flow rate achieving revolution frequency predicting unit 223 predicts a revolution frequency of the fan that satisfies a condition represented as a target flow rate. A revolution frequency "that satisfies a condition represented as a target flow rate" herein means a revolution frequency at which the flow rate of the air caused by rotations of the fan to flow through the ventilation channel becomes equal to or higher than the target flow rate, or higher than the target flow rate. For example, the target flow rate achieving revolution frequency predicting unit 223 predicts a revolution frequency $N_q$ that satisfies the condition represented as a target flow rate $Q_g$ based on Equation (9) below, using the revolution frequency N, and a flow rate $Q_d$ at an operating point that is the intersection between the pressure loss curve and the curve of the actual measurement 50 of the PQ characteristics, and a target flow rate $Q_g$:

$$Q_g = Q_d \times (N_q \div N) \quad (9)$$

The target flow rate achieving revolution frequency predicting unit 223 also determines whether the value of the coefficient k for the pressure loss curve can be changed. A situation in which the value of the coefficient k can be changed is where the ventilation channel and the like to which the fan is installed can be modified as well as the pressure loss characteristic curve ($P=kQ^2$). In one mode for implementing the second embodiment, when the coefficient k can be changed, a determining flag, which is established in advance in the storage unit 110, is set to a predetermined value, and the target flow rate achieving revolution frequency predicting unit 223 determines whether the value of the coefficient k can be changed by referring to the determining flag.

The target flow rate achieving revolution frequency predicting unit 223 repeats changing the value of the coefficient k and predicting the revolution frequency $N_q$ until the value of the coefficient k exceeds a predetermined changeable range, or until when the sound pressure level predicted by the sound volume predicting unit 224, which is to be described later, satisfies the condition represented as the target sound volume.

Figure 7:
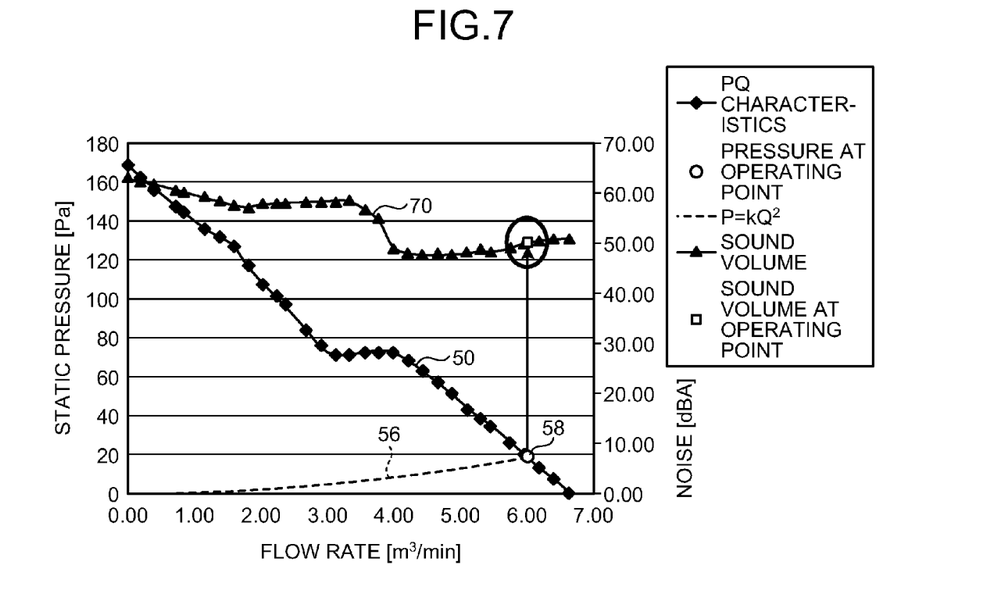
FIG. 7 is a schematic for explaining an example of how a sound pressure level is detected.

The sound volume predicting unit 224 predicts a sound pressure level with the fan being rotated at the revolution frequency $N_q$ satisfying the condition represented as a target flow rate. For example, to begin with, the sound volume predicting unit 224 detects a sound pressure level Lpq corresponding to the flow rate $Q_d$ at the operating point that is the intersection between the pressure loss curve and the curve of the actual measurement 50 of the PQ characteristics. A detection method of the sound pressure level will now be explained with reference to FIG. 7. FIG. 7 is a schematic for explaining an example of how the sound pressure level is detected. In the example illustrated in FIG. 7, the flow rate at the operating point 58 that is the intersection between the pressure loss curve 56 and the curve of the actual measurement 50 of the PQ characteristics is 6.0 [m³/min]. Furthermore, in the example illustrated in FIG. 7, an actual measurement 70 of the sound pressure level corresponding to the flow rate of 6.0 [m³/min] at the operating point 58 is 50.00 [dBA]. In other words, in the example illustrated in FIG. 7, the sound volume predicting unit 224 detects the sound pressure level corresponding to the flow rate at the operating point as 50.00 [dBA].

The sound volume predicting unit 224 then converts the sound pressure level Lpq thus detected into a sound intensity Lpq' [W/m²] based on Equation (10) below:

$$Lpq' = 10^{-12} \times 10^{(Lpq/10)} [W/m^2] \quad (10)$$

The sound volume predicting unit 224 then predicts a sound volume Lpw' with the fan being rotated at the revolution frequency $N_q$ satisfying the condition represented as the target flow rate based on Equation (11) below, using the revolution frequency N, the sound intensity Lpq', and the revolution frequency $N_q$ satisfying the condition represented as the target flow rate:

$$Lpw' = Lpq' \times ((N_q)^6 \div N^6) \quad (11)$$

The sound volume predicting unit 224 then predicts a sound pressure level Lpw with the fan being rotated at revolution frequency $N_q$ satisfying the condition represented as the target flow rate, by converting the sound intensity Lpw' thus predicted into a sound pressure level Lpw based on Equation (12) below:

$$Lpw' = 10^{-12} \times 10^{(Lpw/10)} [W/m^2] \quad (12)$$

Predicting Process

Figure 8:
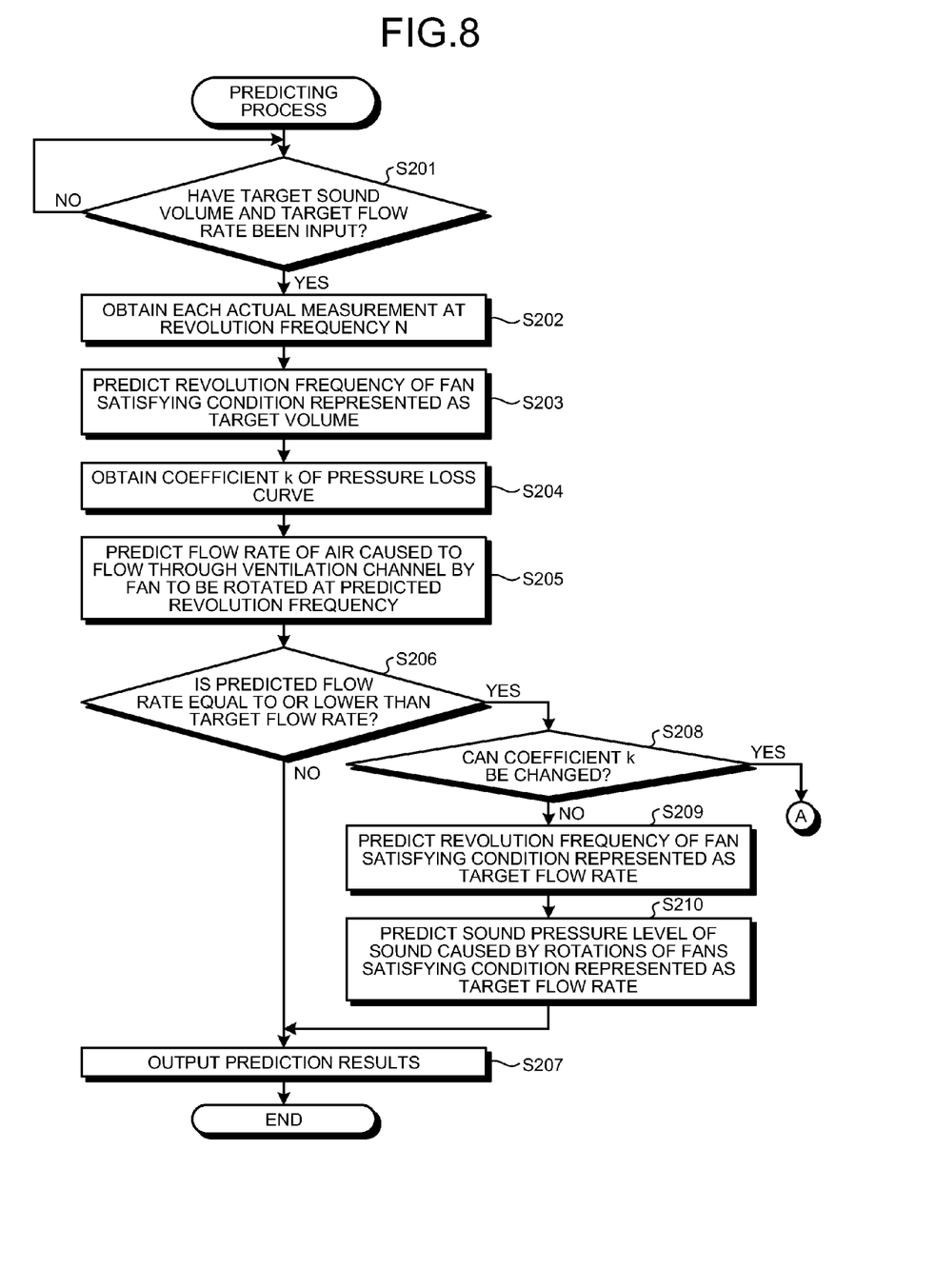
FIG. 8 is a flowchart of an example of a flow of a predicting process according to the second embodiment.
Figure 9:
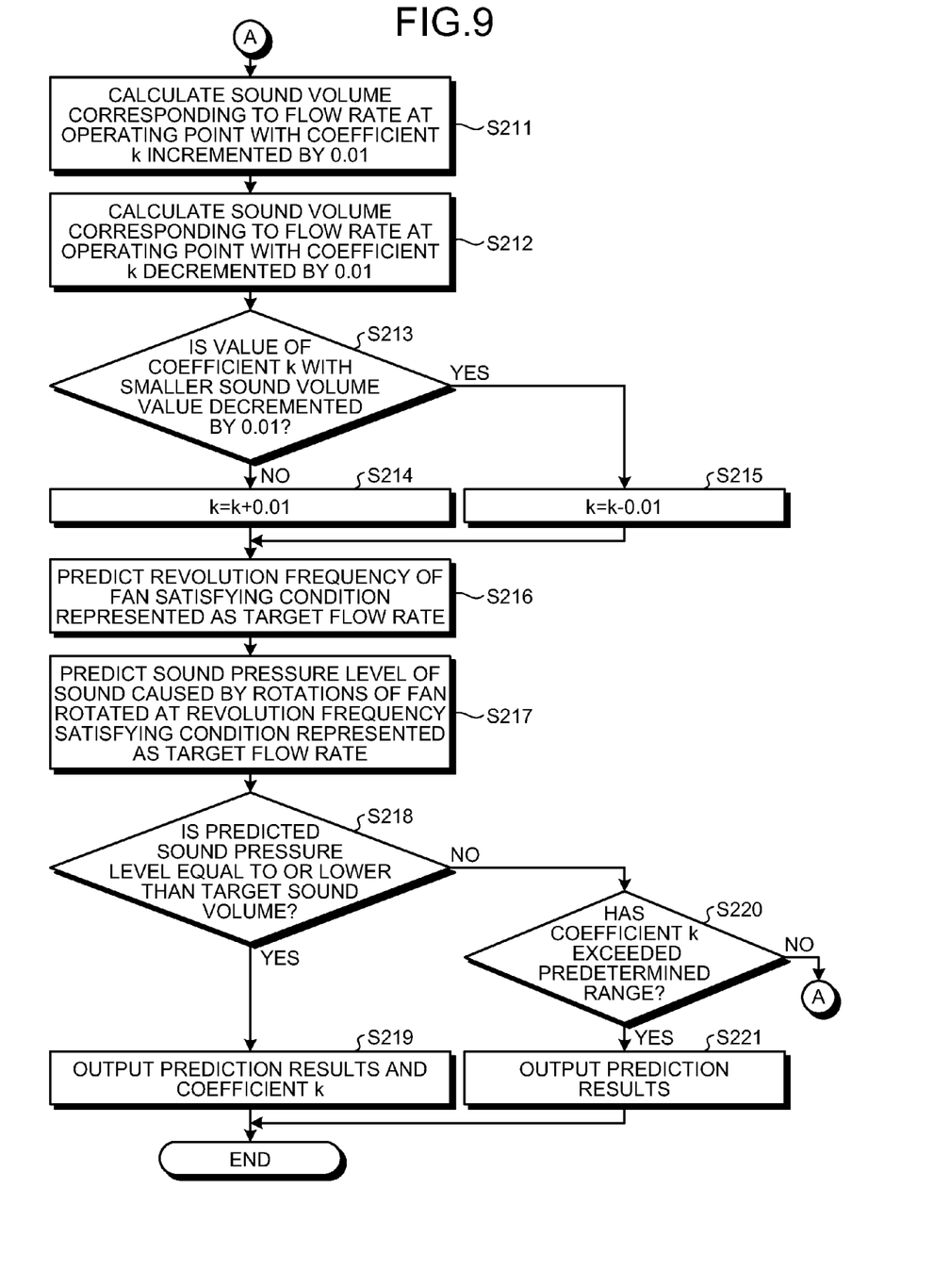
FIG. 9 is another flowchart of the example of the flow of the predicting process according to the second embodiment.

A predicting process according to the second embodiment will now be explained with reference to FIGS. 8 and 9. FIGS. 8 and 9 are a flowchart of an example of the predicting process according to the second embodiment. The predicting process illustrated in FIGS. 8 and 9 is started when the instruction for executing the predicting process is input via the input unit 130.

As illustrated in FIG. 8, when a target sound volume and a target flow rate are input via the input unit 130 (YES at Step S201), the revolution frequency predicting unit 221 obtains the actual measurements 111 from the storage unit 110 (Step S202). The revolution frequency predicting unit 221 then predicts the revolution frequency Ns' of the fan that satisfies the condition represented as the target sound volume (Step S203).

The flow rate predicting unit 222 then obtains the coefficient k of the pressure loss curve (Step S204). The flow rate predicting unit 222 then predicts the flow rate of the air caused to flow through the ventilation channel by the fan to be rotated at the revolution frequency Ns' predicted by the revolution frequency predicting unit 221 (Step S205).

The flow rate predicting unit 222 then determines whether the flow rate predicted at Step S205 is equal to or lower than the target flow rate (Step S206). If the flow rate predicted at Step S205 is not equal to or lower than the target flow rate (NO at Step S206), the flow rate predicting unit 222 determines that both of the conditions represented as the target sound volume and the target flow rate can be satisfied, and performs the process below. That is, the flow rate predicting unit 222 outputs the revolution frequency Ns' of the fan and flow rate thus predicted to the output unit 140 (Step S207), and ends the process.

On the contrary, if the flow rate predicted at Step S205 is equal to or lower than the target flow rate (YES at Step S206), the target flow rate achieving revolution frequency predicting unit 223 further determines whether the value of the coefficient k can be changed (Step S208). If the value of the coefficient k cannot be changed (NO at Step S208), the target flow rate achieving revolution frequency predicting unit 223 predicts the revolution frequency $N_q$ of the fan that satisfies the condition represented as the target flow rate (Step S209). The sound volume predicting unit 224 then predicts the sound pressure level when the fan is rotated at the revolution frequency $N_q$ satisfying the condition represented as the target flow rate (Step S210), outputs the results predicted up to this point (Step S207), and ends the process.

On the contrary, if the value of the coefficient k of the PQ characteristics can be changed (YES at Step S208), the target flow rate achieving revolution frequency predicting unit 223 calculates the sound volume corresponding to the flow rate at the operating point with the coefficient k incremented by 0.01 (Step S211). The target flow rate achieving revolution frequency predicting unit 223 then calculates the sound volume corresponding to the flow rate at the operating point with the coefficient k decremented by 0.01 (Step S212).

The target flow rate achieving revolution frequency predicting unit 223 then determines whether the sound volume calculated at Step S212 is lower than the sound volume calculated at Step S211 (Step S213). If the sound volume calculated at Step S212 is higher than the sound volume calculated at Step S211, or both of the sound volumes are equal (NO at Step S213), the target flow rate achieving revolution frequency predicting unit 223 increments the value of k by 0.01 (Step S214), and goes to Step S216.

On the contrary, if the sound volume calculated at Step S212 is lower than the sound volume calculated at Step S211 (YES at Step S213), the target flow rate achieving revolution frequency predicting unit 223 decrements the value of k by 0.01 (Step S215). The target flow rate achieving revolution frequency predicting unit 223 then predicts the revolution frequency $N_q$ of the fan that satisfies the condition represented as the target flow rate $Q_g$ using the coefficient k thus changed (Step S216).

The sound volume predicting unit 224 then predicts the sound pressure level when the fan is rotated at the revolution frequency $N_q$ satisfying the condition represented as the target flow rate (Step S217) The target flow rate achieving revolution frequency predicting unit 223 then determines whether the sound pressure level predicted at Step S217 satisfies the condition represented as the target sound volume (Step S218). If the sound pressure level predicted at Step S217 satisfies the condition represented as the target sound volume (YES at Step S218), the target flow rate achieving revolution frequency predicting unit 223 determines that both of the conditions represented as the target sound volume and the target flow rate can be satisfied, and performs the process below. That is, the target flow rate achieving revolution frequency predicting unit 223 outputs the results predicted up to this point and the coefficient k to the output unit 140 (Step S219), and ends the process.

On the contrary, if the sound pressure level predicted at Step S217 does not satisfy the condition represented as the target sound volume (NO at Step S218), the target flow rate achieving revolution frequency predicting unit 223 determines if the value of the coefficient k has exceeded a predetermined changeable range (Step S220). If the value of the coefficient k has exceeded the predetermined changeable range (YES at Step S220), the target flow rate achieving revolution frequency predicting unit 223 determines that both of the conditions represented as the target sound volume and the target flow rate cannot be satisfied, and performs the process below. That is, the target flow rate achieving revolution frequency predicting unit 223 outputs the results predicted up to this point to the output unit 140 (Step S221), and ends the process. On the contrary, if the value of the coefficient k has not exceeded the predetermined changeable range (NO at Step S220), the system control goes to Step S211.

Effects Achieved by Second Embodiment

As described above, the predicting apparatus 200 predicts the revolution frequency Ns' at which the sound pressure level satisfies the condition represented as the target sound volume based on the actual measurement of a sound pressure level of sound caused by rotations of the fan being rotated at the predetermined revolution frequency N, and a target sound volume. The predicting apparatus 200 performs the process below based on the revolution frequency Ns', the actual measurement of the PQ characteristics that are characteristics of the static pressure and the flow rate of the fan being rotated at the revolution frequency N, and the pressure loss curve representing the pressure loss characteristics of the ventilation channel of the fan. That is, the predicting apparatus 200 predicts the flow rate of the air caused to flow through the ventilation channel by the fan to be rotated at the revolution frequency Ns' thus predicted.

In this manner, the predicting apparatus 200 according to the second embodiment predicts a revolution frequency Ns' at which the sound pressure level satisfies a condition represented as a target sound volume using the actual measurement of data about the fan being rotated at a certain revolution frequency. Furthermore, the predicting apparatus 200 according to the second embodiment predicts a flow rate of the air caused to flow through the ventilation channel by the fan being rotated at the revolution frequency Ns', using the actual measurement of the data about the fan being rotated at the certain revolution frequency. Therefore, the predicting apparatus 200 according to the second embodiment can predict data about a fan using an actual measurement actually measured in a smaller number of hours than that spent in conventional technologies. Furthermore, with the predicting apparatus 200 according to the second embodiment, because a user can understand a prediction about the flow rate that satisfies a condition represented as a target sound volume, the user can determine whether a condition represented as a target flow rate is satisfied as well. Therefore, when the condition represented as the target sound volume is satisfied but the condition represented as the target flow rate is not satisfied, the user can change the design so as to satisfy both of these conditions, or change the targets by reconsidering the product concept and the like at the designing stage. When both of the conditions represented as the target sound volume and the target flow rate are satisfied, the user can further consider downscaling the product or replacing parts with low-cost parts having a lower cooling performance at the designing stage.

Furthermore, when the flow rate of the air predicted to be caused to flow by the fan being rotated at the revolution frequency Ns' does not satisfy the condition represented as a target flow rate, the predicting apparatus 200 predicts a revolution frequency of the fan that satisfies the condition represented as the target flow rate based on the relationship above, the target flow rate, and the actual measurement of the PQ characteristics. The predicting apparatus 200 then predicts the sound pressure level of the sound caused by rotations of the fan that satisfies the condition represented as the target flow rate, based on the predicted revolution frequency of the fan, and the actual measurement of the sound pressure level. Therefore, the predicting apparatus 200 according to the second embodiment can predict data about a fan using the actual measurements measured in a smaller number of hours than that spent in conventional technologies. Furthermore, with the predicting apparatus 200 according to the second embodiment, the user can understand the sound pressure level of a situation when the condition represented as a target flow rate is satisfied and the condition represented as a target sound volume is not satisfied. In this manner, the user can change a design so as to satisfy both of these conditions, or change the targets by reconsidering the product concept and the like at the designing stage. As mentioned above, when neither one of the target flow rate and the target sound volume is satisfied, a designer can know another prediction that satisfies at least one of the conditions. Therefore, the designer can understand how a design change is impacted by changing the target flow rate or the target sound volume. Hence, the designer is allowed to change a design appropriately in a smaller number of hours than that spent in conventional examples.

Furthermore, the predicting apparatus 200 changes the relationship above when the predicted flow rate of the air caused to flow by the fan to be rotated at the revolution frequency Ns' does not satisfy the condition represented as the target flow rate. The predicting apparatus 200 then repeats predicting the revolution frequency $N_q$ until the value of the coefficient k exceeds a predetermined changeable range, or until the sound pressure level predicted by the sound volume predicting unit 224 satisfies the condition represented as the target sound volume. The predicting apparatus 200 then determines that the conditions represented as the target sound volume and the target flow rate can be satisfied when the predicted sound pressure level satisfies the condition represented as the target sound volume. Therefore, the predicting apparatus 200 according to the second embodiment enables a user to understand whether the conditions represented as the target flow rate and the target sound volume can be satisfied by changing the pressure loss characteristic of the ventilation channel. In this manner, over-designing using costly materials can be prevented at the designing stage. For example, costly alternatives, such as using a high-performance heat sink for reducing the flow rate and a custom made fan, can be avoided.

Furthermore, the predicting apparatus 200 determines neither one of the conditions represented as the target sound volume nor the target flow rate can be satisfied when the relationship thus changed exceeds the changeable range. Therefore, the predicting apparatus 200 according to the second embodiment enables a user to understand that both of the conditions represented as the target sound volume and the target flow rate cannot be satisfied. In this manner, the user can understand that a change in the design other than the pressure loss characteristic is expected, or the target sound volume and the target flow rate have to be changed at the designing stage.

Some of the embodiments of the predicting apparatus disclosed in the present application are explained above. However, the present invention may be implemented in various different modes other than those embodiments described above. Therefore, different embodiments of the present invention will now be explained under the sections (1) Structure of Apparatus and (2) Computer Program Below.

(1) Structure of Apparatus

Processing or control procedures, specific names, and information including various types of data and parameters mentioned herein or in the drawings may be modified in any way except where specified otherwise. Furthermore, each of the elements of the predicting apparatuses 100 and 200 illustrated in the drawings is a merely functional and conceptual depiction, and is not necessary have to be physically configured in the manner illustrated in the drawings. In other words, specific configurations of distribution or integration of the apparatuses are not limited to those illustrated in the drawings, and the whole or a part of the apparatuses may be distributed or integrated in any units functionally or physically depending on various loads or utilization.

(2) Computer Program

Figure 10:
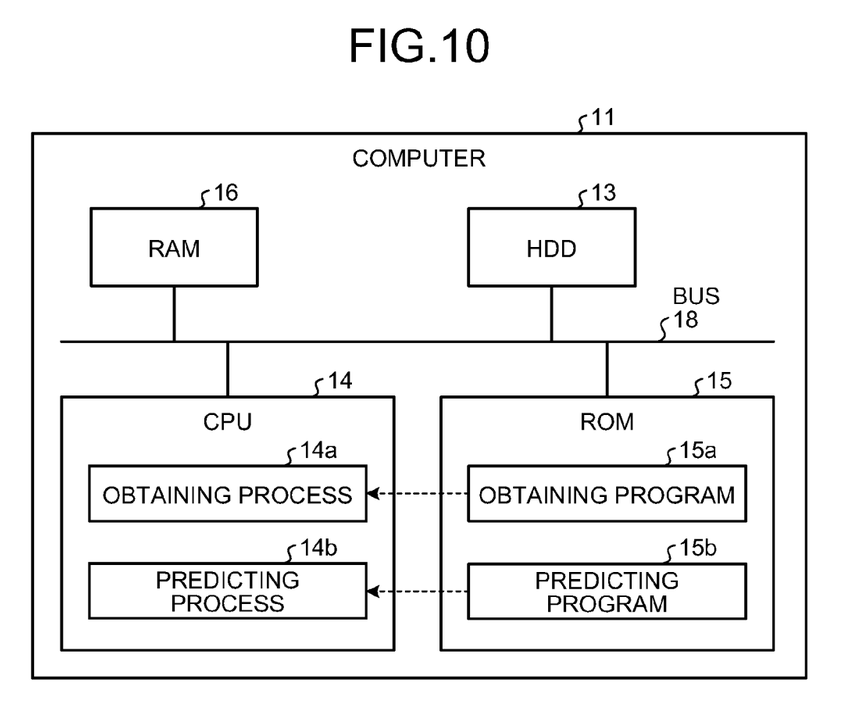
FIG. 10 is a schematic of an example of a computer executing an obtaining program and a predicting program.

According to the embodiments above, the various processes are explained to be realized using hardware logics. However, these processes may be realized by causing a computer to execute a computer program created in advance. Therefore, an example of a computer executing an obtaining program and a predicting program having the same functions as those included in the predicting apparatus 100 described in the first embodiment will be explained below with reference to FIG. 10. In addition, another example of a computer executing a revolution frequency predicting program, a flow rate predicting program, a target flow rate achieving revolution frequency predicting program, and a sound volume predicting program having the same functions as those included in the predicting apparatus 200 described in the second embodiment will be explained below with reference to FIG. 11. FIG. 10 is a schematic of an example of the computer executing the obtaining program and the predicting program.

As illustrated in FIG. 10, a computer 11 as the predicting apparatus 100 includes a hard disk drive (HDD) 13, a central processing unit (CPU) 14, a read-only memory (ROM) 15, and a random access memory (RAM) 16 that are connected via a bus 18.

The obtaining program and the predicting program achieving the same functions as those included in the predicting apparatus 100 according to the first embodiment are stored in the ROM 15 in advance. In other words, an obtaining program 15*a* and a predicting program 15*b* are stored in the ROM 15 in advance, as illustrated in FIG. 10. The obtaining program 15*a* and the predicting program 15*b* may be integrated or distributed as appropriate, in the same manner as for each of the elements included in the predicting apparatus 100 illustrated in FIG. 1.

The CPU 14 reads the obtaining program 15*a* and the predicting program 15*b* from the ROM 15, and executes these computer programs. In this manner, the obtaining program 15*a* and the predicting program 15*b* function as an obtaining process 14*a* and a predicting process 14*b*, respectively, as illustrated in FIG. 10. The obtaining process 14*a* and the predicting process 14*b* correspond to the obtaining unit 121 and the predicting unit 122, respectively, illustrated in FIG. 1. The CPU 14 then executes these computer programs based on data recorded in the RAM 16.

Figure 11:
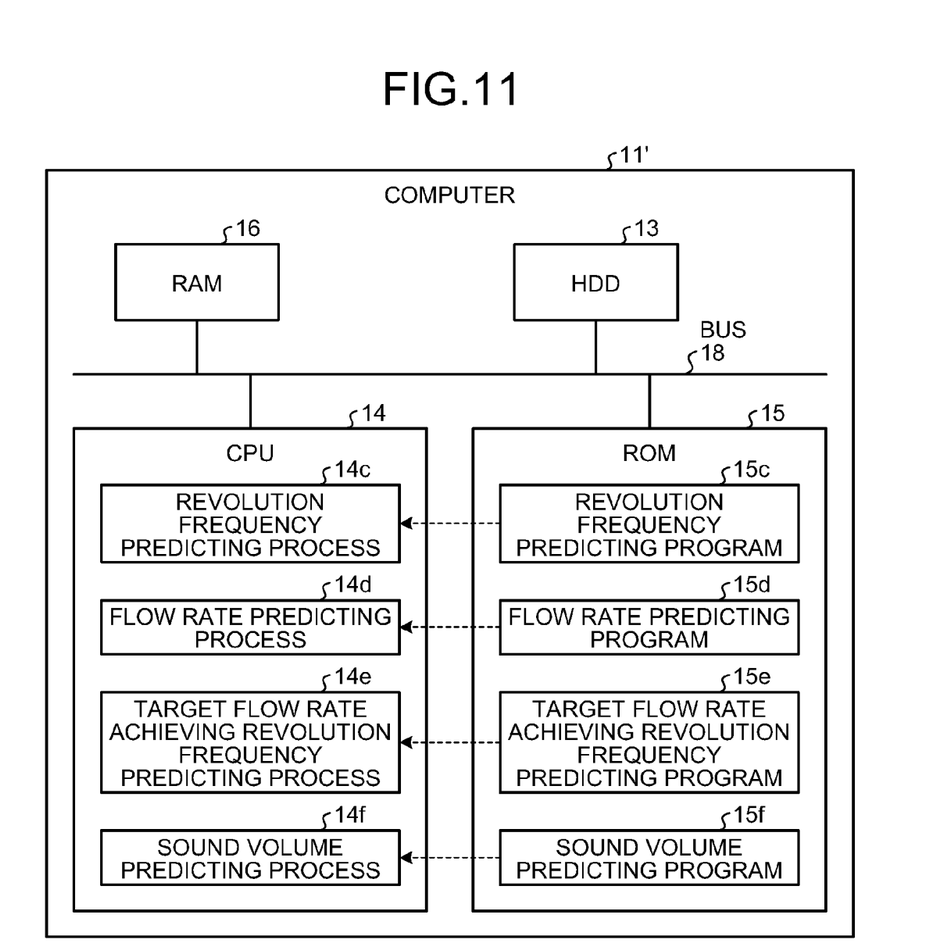
FIG. 11 is a schematic of an example of a computer executing a revolution frequency predicting program, a flow rate predicting program, a target flow rate achieving revolution frequency predicting program, and a sound intensity predicting program.

FIG. 11 is a schematic of an example of a computer executing a revolution frequency predicting program, a flow rate predicting program, a target flow rate achieving revolution frequency predicting program, and a sound volume predicting program. As illustrated in FIG. 11, a computer 11' as the predicting apparatus 200 includes the HDD 13, the CPU 14, the ROM 15, and the RAM 16 which are connected via the bus 18, in the same manner as the computer 11 illustrated in FIG. 10.

The revolution frequency predicting program, the flow rate predicting program, the target flow rate achieving revolution frequency predicting program, and the sound volume predicting program achieving the same functions as those included in the predicting apparatus 200 explained in the second embodiment are stored in the ROM 15 in advance. In other words, a revolution frequency predicting program 15*c*, a flow rate predicting program 15*d*, a target flow rate achieving revolution frequency predicting program 15*e*, and a sound volume predicting program 15*f* are stored in the ROM 15 in advance, as illustrated in FIG. 11. The revolution frequency predicting program 15*c*, the flow rate predicting program 15*d*, the target flow rate achieving revolution frequency predicting program 15*e*, and the sound volume predicting program 15*f* may be integrated or distributed as appropriate, in the same manner as for each of the elements included in the predicting apparatus 200 illustrated in FIG. 6.

The CPU 14 reads the revolution frequency predicting program 15*c*, the flow rate predicting program 15*d*, the target flow rate achieving revolution frequency predicting program 15*e*, and the sound volume predicting program 15*f* from the ROM 15, and executes these computer programs. In this manner, the revolution frequency predicting program 15*c*, the flow rate predicting program 15*d*, the target flow rate achieving revolution frequency predicting program 15*e*, and the sound volume predicting program 15*f* function as a revolution frequency predicting process 14*c*, a flow rate predicting process 14*d*, a target flow rate achieving revolution frequency predicting process 14*e*, and a sound volume predicting process 14*f*, respectively, as illustrated in FIG. 11. The revolution frequency predicting process 14*c*, the flow rate predicting process 14*d*, the target flow rate achieving revolution frequency predicting process 14*e*, and the sound volume predicting process 14*f* correspond to the revolution frequency predicting unit 221, the flow rate predicting unit 222, the target flow rate achieving revolution frequency predicting unit 223, and the sound volume predicting unit 224 respectively, illustrated in FIG. 6. The CPU 14 then executes these computer programs based on data recorded in the RAM 16.

Each of these computer programs does not necessarily have to be stored in the ROM 15 from the beginning. For example, each of these computer programs may be stored in a "portable physical medium" that is inserted into the computer 11 or 11', such as a flexible disk (FD), a compact-disk read-only memory (CD-ROM), a digital versatile disk (DVD), a magneto optical disk, and an integrated circuit (IC) card. Alternatively, each of these computer programs may be stored in a "fixed physical media" arranged internally or externally to the computer 11 or 11', such as a HDD. Alternatively, each of these computer programs may be stored in another "computer (or server)" connected to the computer 11 or 11' over a public circuit, the Internet, a local area network (LAN), or a wide area network (WAN) so as to allow the computer 11 or 11' to read each of these computer programs therefrom and executes the computer programs.

Embodiments of the predicting program, the predicting apparatus, and the predicting method disclosed in the present application have the advantageous effect of predicting data about a fan using actual measurement measured in a smaller number of hours.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer readable non-transitory storage medium storing a predicting program causing a computer to execute a process comprising:
   predicting a first revolution frequency of a fan at which a sound pressure level of sound caused by rotations of the fan satisfies a predetermined target sound volume based on an actual measured value of the sound pressure level derived from the fan rotating at a predetermined revolution frequency; and
   predicting a first flow rate of air that flows through a ventilation channel when the fan rotates at the first revolution frequency an actual measured value of a characteristic related to a static pressure and a flow rate of the fan rotating at the predetermined revolution frequency, and a pressure loss characteristic of the ventilation channel.

2. The non-transitory storage medium storing the predicting program according to claim 1, wherein the process further comprises:
   when the first flow rate does not satisfy a predetermined target flow rate, predicting a second revolution frequency of the fan that satisfies the predetermined target flow rate based on the pressure loss characteristic, the predetermined target flow rate, and the actual measured value of the characteristic related to the static pressure and the flow rate of the fan; and
   predicting a sound pressure level of sound caused by rotations of the fan that satisfies the predetermined target flow rate based on the second revolution frequency and the actual measured value of the sound pressure level.

3. The non-transitory storage medium storing the predicting program according to claim 1, wherein the process further comprises:
   when the first flow rate does not satisfy a predetermined target flow rate, changing the pressure loss characteristic, predicting a second revolution frequency of the fan that satisfies the predetermined target flow rate based on the changed pressure loss characteristic, the predetermined target flow rate, and the actual measured value of the characteristic related to the static pressure and the flow rate of the fan, and predicting a sound pressure level of sound caused by rotations of the fan that satisfies the predetermined target flow rate based on the second revolution frequency and the actual measured value of the sound pressure level;
   repeating the changing, the predicting the second revolution frequency and the predicting the sound pressure level until the predicted sound pressure level satisfies the predetermined target sound volume, or until the changed pressure loss characteristic exceeds a range where the pressure loss characteristic is allowed to change; and
   determining that both of the predetermined target sound volume and the predetermined target flow rate are satisfied when the predicted sound pressure level satisfies the predetermined target sound volume.

4. The non-transitory storage medium storing the predicting program according to claim 3, wherein the process further comprises, when the changed pressure loss characteristic exceeds the range, determining that neither the predetermined target sound volume nor the predetermined target flow rate is satisfied.

5. A predicting apparatus comprising:
   a revolution frequency predicting unit that predicts a first revolution frequency of a fan at which a sound pressure level of sound caused by rotations of the fan satisfies a predetermined target sound volume based on an actual measured value of the sound pressure level derived from the fan rotating at a predetermined revolution frequency;
   a flow rate predicting unit that predicts a first flow rate of air that flows through a ventilation channel when the fan rotates at the first revolution frequency predicted by the revolution frequency predicting unit based on an actual measured value of a characteristic related to a static pressure and a flow rate of the fan rotating at the predetermined revolution frequency, and a pressure loss characteristic of the ventilation channel.

6. A predicting method comprising:
   predicting, using a processor, a first revolution frequency of a fan at which a sound pressure level of sound caused by rotations of the fan satisfies a predetermined target sound volume based on an actual measured value of the sound pressure level derived from the fan rotating at a predetermined revolution frequency; and
   predicting a first flow rate of air that flows through a ventilation channel when the fan rotates at the first revolution frequency based on an actual measured value of a characteristic related to a static pressure and a flow rate of the fan rotating at the predetermined revolution frequency, and a pressure loss characteristic of the ventilation channel.

* * * * *

UNITED STATES PATENT AND TRADEMARK OFFICE
CERTIFICATE OF CORRECTION

PATENT NO. : 8,892,369 B2  Page 1 of 1
APPLICATION NO. : 13/221112
DATED : November 18, 2014
INVENTOR(S) : Hiroyuki Furuya et al.

It is certified that error appears in the above-identified patent and that said Letters Patent is hereby corrected as shown below:

In the Claims

Column 15, line 50, in claim 1, after "frequency" insert -- based on --.

Signed and Sealed this
Thirtieth Day of June, 2015

Michelle K. Lee
*Director of the United States Patent and Trademark Office*